(12) United States Patent  
Frosien

(10) Patent No.: US 9,245,709 B1  
(45) Date of Patent: Jan. 26, 2016

(54) CHARGED PARTICLE BEAM SPECIMEN INSPECTION SYSTEM AND METHOD FOR OPERATION THEREOF

(71) Applicant: ICT Integrated Circuit Testing Gesellschaft für Halbleiterprüftechnik mbH, Heimstetten (DE)

(72) Inventor: Jürgen Frosien, Riemerling (DE)

(73) Assignee: ICT Integrated Circuit Testing Gesellschaft für Halbleiterprüftechnik mbH, Heimstetten (DE)

( * ) Notice: Subject to any disclaimer, the term of this patent is extended or adjusted under 35 U.S.C. 154(b) by 0 days.

(21) Appl. No.: 14/499,843

(22) Filed: Sep. 29, 2014

(51) Int. Cl.
*H01J 37/02* (2006.01)
*H01J 37/145* (2006.01)
*H01J 37/28* (2006.01)

(52) U.S. Cl.
CPC ............... *H01J 37/145* (2013.01); *H01J 37/28* (2013.01)

(58) Field of Classification Search
USPC ................................. 250/306, 307, 310, 311
See application file for complete search history.

(56) References Cited

U.S. PATENT DOCUMENTS

2012/0141693 A1* 6/2012 Ward et al. ............ 427/585

* cited by examiner

*Primary Examiner* — Nicole Ippolito
*Assistant Examiner* — Hanway Chang
(74) *Attorney, Agent, or Firm* — Kilpatrick Townsend & Stockton LLP

(57) ABSTRACT

A charged particle beam specimen inspection system is described. The system includes an emitter for emitting at least one charged particle beam, a specimen support table configured for supporting the specimen, an objective lens for focusing the at least one charged particle beam, a charge control electrode provided between the objective lens and the specimen support table, wherein the charge control electrode has at least one aperture opening for the at least one charged particle beam, and a flood gun configured to emit further charged particles for charging of the specimen, wherein the charge control electrode has a flood gun aperture opening at which a conductive membrane is provided which is positioned between the flood gun and the specimen support table.

20 Claims, 7 Drawing Sheets

CHARGED PARTICLE BEAM SPECIMEN INSPECTION SYSTEM AND METHOD FOR OPERATION THEREOF

FIELD OF THE DISCLOSURE

Embodiments of the present disclosure relate to devices for imaging a specimen, e.g. a wafer, with one or more charged particle beams and including a flood gun. Embodiments of the present disclosure particularly relate to a charged particle beam specimen inspection system having an objective lens and a flood gun, a multi-beam specimen inspection system, and a method of operating a charged particle beam specimen inspection system.

DESCRIPTION OF THE RELATED ART

Charged particle beam apparatuses have many functions, in a plurality of industrial fields, including, but not limited to, electron beam (wafer and mask) inspection, critical dimensioning of semiconductor devices during manufacturing, defect review of semiconductor devices during manufacturing, exposure systems for lithography, detecting devices and testing systems. Thus, there is a high demand for structuring, testing and inspecting specimens within the micrometer and nanometer scale.

Micrometer and nanometer scale process control, inspection or structuring is often done with charged particle beams, e.g. electron beams, which are generated and focused in charged particle beam devices, such as electron microscopes or electron beam pattern generators. Charged particle beams offer superior spatial resolution compared to, e.g. photon beams due to their short wavelengths.

Particularly for electron beam inspection (EBI) technology, throughput is of foremost interest. It is inter alia referred to, in particular, to surface inspection at low landing energies <500 e V and low secondary electron (SE) extraction fields. Normally, for high current density electron probe generation, compound objective lenses are used (superimposed magnetic and electrostatic retarding field lenses). In those lenses, the electron energy inside the column is reduced to the final landing energy. Further, for the purpose of pre-charging a wafer to a desirable surface potential, for example in order to increase detection sensitivity of voltage contrast (VC) defects in the wafer fabrication process, or to dis-charge/neutralize wafer charging effects, a flood gun can be used.

In view of the above, it is beneficial to provide an improved charged particle beam device and a method of operating thereof that overcome at least some of the problems in the art.

SUMMARY OF THE DISCLOSURE

In light of the above, an improved charged particle beam wafer inspection system, an improved multi-beam wafer imaging system, and an improved method of operating a charged particle beam wafer imaging system according to the independent claims are provided. Further advantages, features, aspects and details are evident from the dependent claims, the description and the drawings.

According to one aspect of the present disclosure, a charged particle beam specimen inspection system is provided. The system includes an emitter for emitting at least one charged particle beam, a specimen support table configured for supporting the specimen, an objective lens for focusing the at least one charged particle beam, a charge control electrode provided between the objective lens and the specimen support table, wherein the charge control electrode has at least one aperture opening for the at least one charged particle beam, and a flood gun configured to emit further charged particles for charging of the specimen, wherein the charge control electrode has a flood gun aperture opening at which a conductive membrane is provided which is positioned between the flood gun and the specimen support table.

According to another aspect of the present disclosure, a multi-beam specimen inspection system is provided. The multi-beam specimen inspection system includes a charged particle beam specimen inspection system. The charged particle beam specimen inspection system includes an emitter for emitting at least one charged particle beam, a specimen support table configured for supporting the specimen, an objective lens for focusing the at least one charged particle beam, a charge control electrode provided between the objective lens and the specimen support table, wherein the charge control electrode has at least one aperture opening for the at least one charged particle beam, and a flood gun configured to emit further charged particles for charging of the specimen, wherein the charge control electrode has a flood gun aperture opening at which a conductive membrane is provided which is positioned between the flood gun and the specimen support table. The multi-beam specimen inspection system further includes at least one further emitter for emitting at least one further charged particle beam, wherein the charge control electrode has at least one further aperture opening for the at least one further charged particle beam.

According to a further aspect of the present disclosure, a method of operating a charged particle beam specimen imaging system is provided. The method includes biasing a charge control electrode to a first potential, moving a specimen support table for positioning a first portion of a specimen below a flood gun aperture opening in the charge control electrode, wherein at the flood gun aperture opening a conductive membrane is provided which is positioned between the flood gun and the specimen support table; pre-charging the first portion of the specimen with charged particles emitted from a flood gun, and moving the specimen support table for positioning the first portion of the specimen below a first aperture opening in the charge control electrode, wherein the first aperture opening is aligned with an optical axis of an objective lens of a scanning charged particle beam unit.

BRIEF DESCRIPTION OF THE DRAWINGS

So that the manner in which the above recited features of the present disclosure can be understood in detail, a more particular description of the disclosure, briefly summarized above, may be had by reference to embodiments. It is to be noted, that the appended drawings illustrate exemplary embodiments and are therefore not to be considered limiting of the scope of the present disclosure. In the drawings.

DETAILED DESCRIPTION OF EMBODIMENTS

Figure 1:
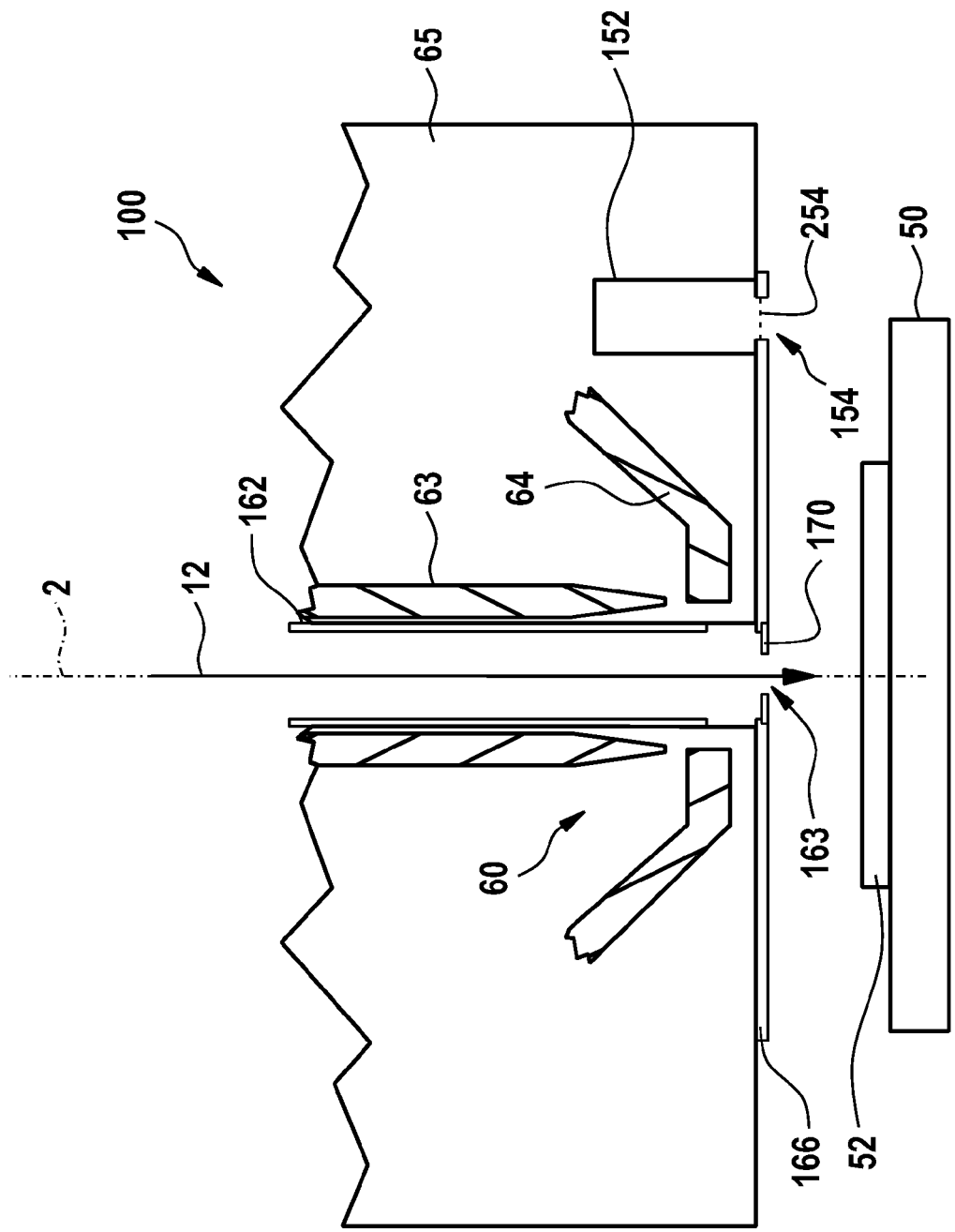
FIG. 1 illustrates a schematic partial view of a charged particle beam specimen inspection system according to embodiments described herein.

Reference will now be made in detail to the various embodiments of the disclosure, one or more examples of which are illustrated in the figures. Within the following description of the drawings, the same reference numbers refer to same components. In the following, only the differences with respect to individual embodiments are described. Each example is provided by way of explanation of the disclosure and is not meant as a limitation of the disclosure. Further, features illustrated or described as part of one embodiment can be used on or in conjunction with other embodiments to yield yet a further embodiment. It is intended that the description includes such modifications and variations.

Without limiting the scope of protection of the present application, in the following the charged particle beam device or components thereof will exemplarily be referred to as an electron beam device including the detection of secondary electrons and/or backscattered electrons, which are also referred to as signal electrons. Embodiments can still be applied for apparatuses, systems and methods, in which the charged particle beam may alternatively be an ion beam. Embodiments can still be applied for apparatuses and components detecting corpuscles such as secondary and/or backscattered charged particles in the form of electrons or ions, photons, X-rays or other signals in order to obtain a specimen image. In the present disclosure, when referring to corpuscles they are to be understood as a light signal in which the corpuscles are photons as well as particles, in which the corpuscles are ions, atoms, electrons or other particles.

In the present disclosure, a "specimen" or "wafer" as referred to herein, includes, but is not limited to, semiconductor wafers, semiconductor workpieces, and other workpieces such as memory disks, masks, substrates for flat panel displays and the like. According to some embodiments, a specimen can be selected from the group consisting of: a wafer, a mask, a substrate for a flat panel display, and a flat panel display. Embodiments of the present disclosure may be applied to any workpiece which is structured or on which material is deposited. A specimen or wafer includes a surface to be imaged and/or structured or on which layers are deposited, an edge, and typically a bevel.

According to some embodiments, which can be combined with other embodiments described herein, the apparatus and methods are configured for or are applied for electron beam inspection (EBI), critical dimension measurement and defect review applications, where the microscopes and methods according to embodiments described herein, can be beneficially used in light of high throughput of these applications. According to some embodiments described herein, an E-beam inspection (EBI), critical dimension measurement (CD) tool, and/or defect review (DR) tool can be provided, wherein high resolution, large field of view, and high scanning speed can be achieved. According to embodiments described herein, a wafer imaging system or a wafer SEM inspection tool refers to EBI tools, CD tools or DR tools, which are specific tools as understood by a person skilled in the art.

Embodiments of the charged particle beam specimen inspection system described herein relate to systems being a single or multi column scanning electron microscope having a flood gun. The flood gun may be provided such that the objective lens and the flood gun shares a charge control electrode and/or the flood gun may be provided to be at least partially within the objective lens housing. Accordingly, the scanning electron microscope and the flood gun are combined together in one charged particle beam specimen inspection system, which may for example be employed for wafer inspection and referred to as wafer inspection apparatus. According to some embodiments, which can be combined with other embodiments described herein, the objective lens and the flood gun may share at least some electrostatic components and/or may be provided in a common magnetic environment. Accordingly, the throughput of a wafer inspection system can be further improved.

FIG. 1 shows a portion of a charged particle beam specimen inspection system 100 according to embodiments described herein. The objective lens 60 includes the magnetic lens assembly having an upper pole piece 63, a lower pole piece 64 and a coil (not shown in FIG. 1). The objective lens further includes an electrostatic lens component having a first electrode 162, i.e. upper electrode in the figures, and a charge control electrode 166, i.e. lower electrode in the figures. Further, a control electrode 170 for control of the signal electrons or the extraction field acting on the signal electrons respectively is provided at a position along the optical axis 2 from the position of the charge control electrode 166 to the specimen support table 50 or the specimen 52 respectively. The control electrode 170 may be provided within the charge control electrode 166. The control electrode 170 can, for example, have essentially the same position along the optical axis as the charge control electrode 166. The charge control electrode 166 can also be referred to as big proxi or large proxi and the control electrode 170 can also be referred to as small proxi. According to some embodiments, the small proxi can be at the same distance from the specimen as the large proxi. According to other embodiments, the small proxi is closer to the specimen as the large proxi.

According to embodiments described herein, the objective lens for an electron beam system, i.e. the last lens before the electron beam impinges on the specimen or wafer, includes a magnetic-electrostatic lens. As exemplarily shown in FIG. 1, the electrostatic lens component includes an upper electrode (e.g. the first electrode 162), which may lie on a high potential, and a lower electrode, e.g. charge control electrode 166, which may lie on a potential close to the sample voltage and which decelerates the electrons for providing the desired landing energy. These electrodes contribute to focusing the beam as well as to slowing the beam down to the desired low primary beam voltage.

According to the embodiments described herein, it is understood that the small proxi, i.e. the control electrode 170, has a small influence on the properties of the electrostatic lens component, yet is sufficiently small enough to be considered an individual element, with the functionality to control the extraction of the SEs from the specimen or the guidance of SEs released from the specimen.

The objective lens 60 focuses the electron beam 12, which travels in the column along optical axis 2, on the specimen 52, i.e. in a specimen plane. The specimen 52 is supported on a specimen support table 50. According to some embodiments, which can be combined with other embodiments described herein, scanning of an area of the specimen can be conducted by movement of the table in a first direction essentially perpendicular to the optical axis and by scanning lines in another, second direction essentially perpendicular to the optical axis and essentially perpendicular to the first direction.

As exemplarily shown in FIG. 1, according to the embodiments described herein, a flood gun 152 is provided in the charged particle beam specimen inspection system 100. For example, the flood gun 152 may share the charge control electrode 166 with the charged particle beam specimen inspection system 100. According to embodiments described herein, the charge control electrode 166 may have at least one aperture opening 163 and a flood gun aperture opening 154 at which a conductive membrane 254 is provided which is positioned between the flood gun and the specimen support table. Accordingly by providing a conductive membrane at the flood gun aperture a specimen surface charging with very high homogeneity of the flooded area can be achieved, which is particularly beneficial for EBI. Hence, embodiments as described herein are capable of providing a constant surface potential at a specimen to be assessed which can assure that imaging of surface details can be performed under constant imaging conditions. Accordingly, embodiments as described herein provide for imaging of specimens, e.g. a wafer, with constant contrast, constant resolution and without image drift.

In the present disclosure, the expression "conductive membrane" may be understood as a membrane including a conductive material. Accordingly, a conductive membrane may be a membrane made of a conductive material or a membrane of a non-conductive material which is coated with a conductive material. Further, a conductive membrane may be understood as a membrane which has been made conductive by physical or chemical methods as described herein, for example by doping, ion implantation or chemical surface treatment.

A conductive material as described herein may be understood as a material having an intrinsic conductivity and/or an extrinsic conductivity which has been induced in the crystal lattice of the material by the incorporation of foreign atoms. For example, the extrinsic conductivity of the material may be obtained by introduction of a dopant into the material for providing the conductivity. Depending on the dopant introduced an n-type semiconductor (having negative charge carriers) or p-type semiconductor (having positive charge carriers) can be obtained. The dopants can be introduced by physical or chemical methods. For example, the dopants can be diffused into the material by contact with gaseous or liquid compounds of the desired element. Alternatively, the dopants may be introduced into the material by ion implantation. Ion implantation may beneficially be used to accurately position the doped regions within the material.

According to the embodiments described herein, which can be combined with other embodiments described herein, the conductive membrane may have a thickness from a lower limit of 10 nm, particularly a lower limit of 20 nm, particularly a lower limit of 50 nm to an upper limit of 350 nm, particularly an upper limit of 500 nm m, particularly an upper limit of 2 µm. Accordingly, by selecting a conductive membrane as described herein, the penetration rate of the flooding beam can be adjusted. In particular, a membrane with a lower thickness may result in a higher penetration rate compared to a membrane with a higher thickness.

According to the embodiments described herein, which can be combined with other embodiments described herein, the conductive membrane is made of at least one material selected from the group consisting of: silicon oxide ($SiO_2$), silicon nitride ($Si_3N_4$), silicon carbide (SiC), diamond, graphene, and kapton. Accordingly, by selecting the material of the conductive membrane as described herein, the penetration rate of the flooding beam may be adjusted. In particular, a membrane made of a material having a higher density may result in a lower penetration rate compared to a membrane made of a material having a lower density. Further, by selecting the material of the conductive membrane the physical and chemical properties of the membrane may be selected. For example, the thermal conductivity, the electrical conductivity, the mechanical and thermal stability etc. of the membrane may be selected.

According to the embodiments described herein, which can be combined with other embodiments described herein, the conductive membrane includes a conductive coating. The conductive coating may include at least one material selected from the group consisting of: platinum (Pt) and graphite (C). Accordingly, by selecting the material of the conductive coating as described herein, the penetration rate of the flooding beam may be adjusted. In particular, a membrane with a coating made of a material with a higher density may result in a lower penetration rate compared to a membrane with a coating made of a material having a lower density. Further, by selecting the material of the coating the physical and chemical properties of the membrane may be selected. For example, the thermal conductivity, the electrical conductivity, the mechanical and thermal stability etc. of the membrane can be selected.

According to the embodiments described herein, which can be combined with other embodiments described herein, the conductive membrane has been made conductive by a physical of chemical treatment, for example by ion implantation or chemical surface treatment. Accordingly, the properties of the conductive membrane, such as the thermal conductivity and the electrical conductivity, may be adjusted by process parameters of the respective physical or chemical treatment method employed.

According to the embodiments described herein, which can be combined with other embodiments described herein, the resistivity of the conductive membrane is less than $1\times10^{11}$ Ωcm, particularly less than $1\times10^{10}$ Ωcm, particularly less than $1\times10^{9}$ Ωcm. The resistivity of the conductive membrane may be the surface resistivity of the membrane. Alternatively, the resistivity of the conductive membrane may be the bulk resistivity of the membrane. Accordingly, by providing a conductive membrane with a resistivity as described herein, a fast flooding and establishing of a stabilized surface charge of the specimen can be achieved.

According to the embodiments, which can be combined with other embodiments described herein, the specimen support table 50 can be moved to a first position, in which the electron beam 12 impinges on the specimen 52, for example a position as shown in FIG. 1. The specimen support table 50 can further be moved to a second position, in which charged particles emitted from the flood gun impinge on the specimen 52, for example a wafer.

According to further embodiments, which can be combined with other embodiments described herein, a charged particle beam specimen inspection system may include an objective lens housing 65. As exemplarily shown in FIG. 1, the objective lens housing 65 may surround the objective lens, and particularly the upper pole piece 63 and the lower pole piece 64. For example, the objective lens housing 65 can be magnetically insulated from the pole pieces by an air gap or a magnetic insulator, i.e. a material with a relative permeability µ/µo=1, such as copper or the like. According to some embodiments, which can be combined with other embodiments described herein, the objective lens housing 65 can include a material having a relative permeability $\mu/\mu_0$ of 10000 or above, for example mu-metal or the like. The flood gun 152 and the objective lens 60 may share the same magnetic environment by having the objective lens housing 65 surrounding at least a portion of the flood gun 152. The objective lens housing can shield the fields of nearby SEM columns or other devices for the objective lens 60 and the flood gun 152.

According to some embodiments described herein, the objective lens, can be electrostatic, magnetic or combined magnetic-electrostatic. A magnetic lens or a magnetic lens assembly can be provided by a permanent magnet, a coil, or a combination thereof. For example the objective lens can have a magnetic lens assembly including one or more pole pieces. According to embodiments described herein, an objective lens having surrounds the objective lens and shields one or both of magnetic fields and electrostatic fields. The objective lens housing may surround at least a portion of the flood gun. Accordingly, the flood gun can be placed close to the objective lens.

Sharing at least one of the charge control electrode and the objective lens housing 65 allows for reduced costs and a small footprint of the inspection system. Further, the flood gun 152 can be provided at a distance from the scanning electron beam components such that the specimen support table 50 can move the specimen 52 from the electron beam to a position below the flood gun 152 and vice versa in a reduced time. The specimen support table 50 may include an X-Y-stage navigation system, which is configured to move the specimen, for example a wafer, under the SEM column and/or the flood gun. Further, a controller 263 for controlling the movement of the specimen support table 50 can be provided. According to embodiments described herein, power supplies and individual controllers can be controlled by a main controller 250, such as a main computer having at least a CPU and a memory.

Figure 2:
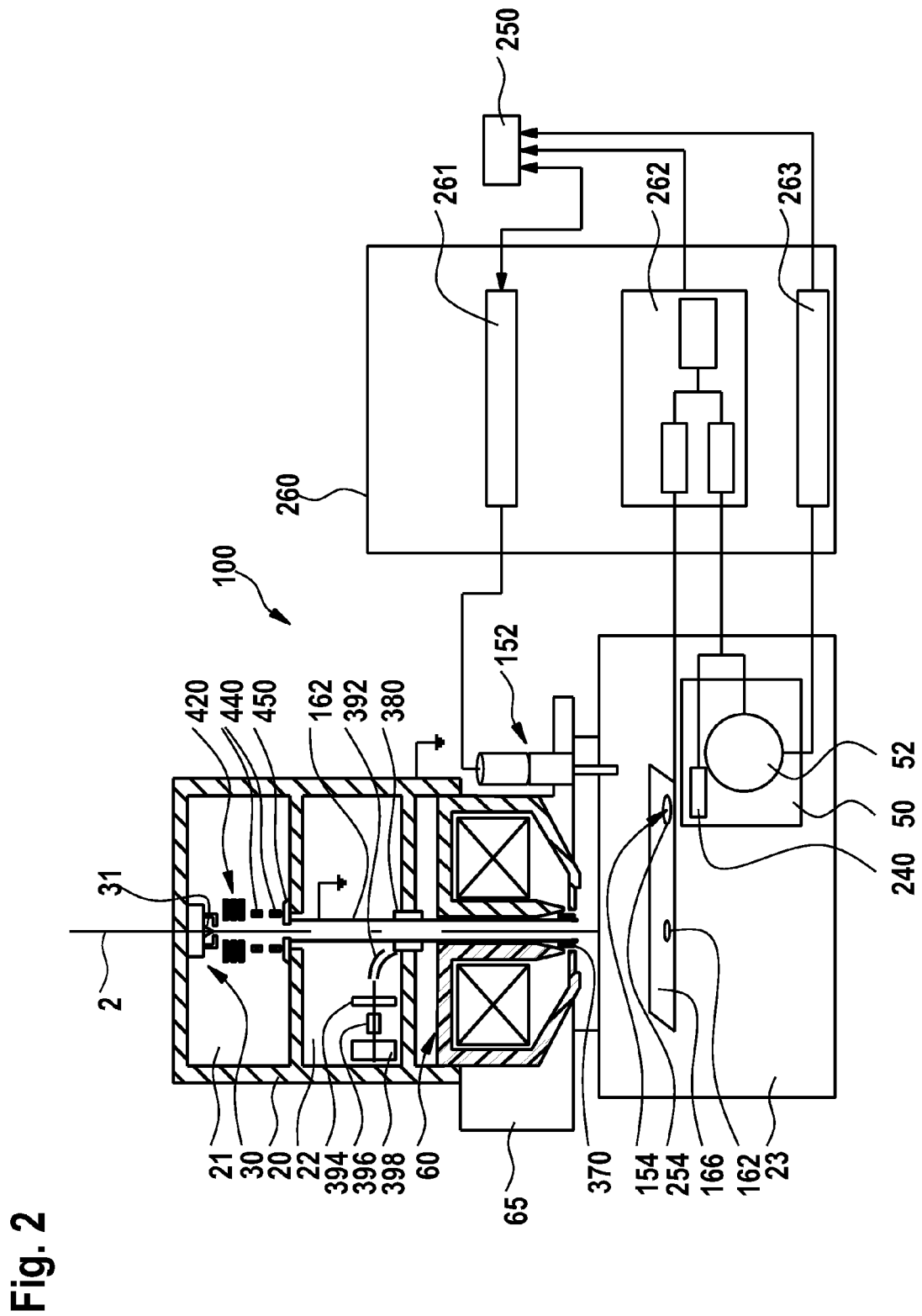
FIG. 2 illustrates a schematic view of a charged particle beam specimen inspection system according to embodiments described herein.

FIG. 2 shows a charged particle beam device, such as an SEM imaging apparatus, i.e. scanning electron microscope having a flood gun 152. The electron beam column 20 provides a first chamber 21, a second chamber 22 and a third chamber 23. The first chamber, which can also be referred to as a gun chamber, includes the electron beam source 30 having an emitter 31 and suppressor.

According to embodiments described herein, the emitter 31 is connected to a power supply for providing a voltage to the emitter. The emitter can be an emitter of one or more emitters of an emitter assembly. For the examples described herein, the potential provided to the emitter is such that the electron beam is accelerated to an energy of 8 keV or above, e.g. 30 keV. Accordingly, typically the emitter is biased to a potential of −8 keV or higher negative voltages, e.g. in the case where the column and the beam guiding tube, which also provides the first electrode 162 in FIG. 2, are on ground potential. However, higher beam energies inside the column, e.g. 20 keV or higher, will be even more advantageous for the electron optical performance (e.g. resolution or current density). As described above, embodiments having the emitter on a negative potential are beneficial in that the column and the beam guiding tube can be at ground or at a moderate potential. According to embodiments described herein, the emitter could also be grounded and a power supply could be connected to the first electrode 162 shown in FIG. 2.

With exemplary reference to FIG. 2, an electron beam is generated by the electron beam source 30. The beam is aligned to the beam-shaping aperture 450, which is dimensioned to shape the beam, for example the beam-shaping aperture 450 may block a portion of the beam. Thereafter, the beam passes through the beam separator 380, which separates the primary electron beam and the signal electron beam, i.e. the signal electrons. The primary electron beam is focused on the specimen 52, e.g. a wafer, by the objective lens. The specimen is positioned on the specimen stage, i.e. a specimen support table 50. Upon impingement of the electron beam, for example, secondary or backscattered electrons are released from the specimen 52, which can be detected by the detector 398. Even though backscattered electrons and secondary electrons are typically detected by the detector, some passages of this disclosure relate to secondary electrons only, i.e. as a comparison to primary electrons. It is understood that backscattered electrons are also considered to be signal electrons or similar to secondary electrons as understood herein, i.e. there are secondary products for signal generation of the image.

According to some embodiments, as exemplary shown in FIG. 2, which can be combined with other embodiments described herein, a condenser lens 420 and a beam shaping aperture 450 or beam-limiting aperture is provided. The two-stage deflection system 440 is provided between the condenser lens and the beam-shaping aperture 450 for alignment of the beam to the beam shaping aperture. According to embodiments described herein, which can be combined with other embodiments described herein, the electrons are accelerated to the voltage in the column by an extractor or by the anode. For example, the extractor can be provided by the first (upper) electrode of the condenser lens 420 or by a further electrode (not shown). According to yet further embodiments, the condenser lens may also be a magnetic condenser lens for controlling the probe diameter.

Further, a scanning deflector assembly 370 may be provided. For example, the scanning deflector assembly 370 can be a magnetic, but preferably an electrostatic scanning deflector assembly, which is configured for high pixel rates. According to embodiments, which can be combined with other embodiments described herein, the scanning deflector assembly 370 can be a single stage assembly as exemplarily shown in FIG. 2. Alternatively, also a two-stage or even a three-stage deflector assembly can be provided. Each stage of the deflector assembly can be provided at a different position along the optical axis 2.

According to embodiments described herein, signal electrons, e.g. secondary and/or backscattered electrons, are extracted from the wafer or specimen e.g. by a control electrode and are further accelerated within the objective lens. The beam separator 380 separates the primary electrons and the signal electrons. The beam separator can be a Wien filter and/or can be at least one magnetic deflector, such that the signal electrons are deflected away from the optical axis 2. The signal electrons are then guided by a beam bender 392, e.g. a hemispherical beam bender, and a lens 394 to the detector 398. Further elements like a filter 396 can be provided. According to yet further modifications, the detector can be a segmented detector configured for detecting signal electrons depending on the starting angle at the specimen.

With exemplary reference to FIG. 2, according to some embodiments which can be combined with other embodiments described herein an objective lens housing 65 may surround the objective lens 60. Further, at least a portion of the flood gun 152 can be surrounded by the objective lens housing 65. According to some embodiments, the objective lens and the flood gun can have a common objective lens housing. The charge control electrode 166 may be provided between the specimen 52 (or the wafer support table, respectively) and the common objective lens housing 65. This allows for controlling the charging potential of the specimen surface, e.g. the wafer surface, under the flood gun and the scanning electron microscope column. The voltage difference between the specimen, e.g. the wafer, and the charge control electrode determines the resultant specimen surface potential, e.g. the wafer surface potential. Flood gun electrons, i.e. the charged particles emitted from the flood gun, pass the charge control electrode 166 through the flood gun aperture opening 154 at which a conductive membrane 254 is provided. Accordingly by providing a conductive membrane at the flood gun aperture a specimen surface charging with very high homogeneity of the flooded area can be achieved, which is particularly beneficial for EBI. Hence, embodiments as described herein are capable of providing a constant surface potential to a specimen to be assessed which can assure that imaging of surface details can be performed under constant imaging conditions. Accordingly, embodiments as described herein provide for imaging of specimens, e.g. a wafer, with constant contrast, constant resolution without image drifts.

Further, as exemplarily shown in FIG. 2, the flood gun 152 may be provided with a first power supply 261. The first power supply 261 can be provided in an electrical cabinet 260. Further, the charged particle beam specimen inspection system may include a second power supply 262 for biasing the charge control electrode 166, the specimen support table 50 and the specimen, respectively, to a desired potential. The voltage potential of the specimen on may determine the landing energy of the electrons on the specimen, e.g. the wafer.

In the context of the embodiments described herein, without limiting the scope of protection thereto, an intermediate beam acceleration system intends to describe a charged particle beam apparatus with initial high acceleration of the charged particles which will be decelerated to a landing energy shortly before striking the specimen or wafer. The energy or velocity ratio $v_{acc}/v_{landing}$ between the acceleration velocity $v_{acc}$ at which the charged particles are guided through the column and the landing velocity $V_{landing}$ at which the charged particles strike the specimen can be about at least 10 or higher, e.g. 20 or higher. Furthermore, the landing energy can be 5 keV or less, e.g. 1 keV or less, such as 500 eV or even 100 eV.

According to embodiments, which can be combined with other embodiments described herein, the emission current of the flood gun can be up to 5 mA, for example, 50 µA to 500 µA, such as 100 µA to 300 µA. The high emission current of the flood gun allows for a better throughput of the inspection system since pre-charging and/or dis-charging can be conducted in a much shorter time. According to yet further additional or alternative embodiments, the spot size in the plane of the specimen or wafer can be 7 mm or below, for example 3 mm to 6 mm, such as about 5 mm. Accordingly, the current density is lower when using a flood gun, for example in the range of 1 µA/mm² to 10 µA/mm². This reduces the likelihood of having artifacts when inspecting a specimen, for example a wafer. Yet, the higher emission current allows for charging some types of layers to the desired potential, which could not be charged with the electron beam of the scanning electron beam column. Particularly, layers having a large capacitance may not be charged to the desired potential with an electron beam of a scanning electron microscope.

Embodiments described herein can be utilized for or can include pre-charging a specimen, e.g. a wafer, to a desirable surface potential, for example in order to increase detection sensitivity of voltage contrast (VC) defects in the wafer fabrication process, and scanning an electron beam of a scanning electron beam microscope over the pre-charged surface thereafter. According to some embodiments, the uniformity of pre-charging over a scanned area can be 5 V peak-to-peak or below.

As exemplarily shown in FIG. 2, according to embodiments which can be combined with other embodiments described herein the flood gun 152 may use a common interface with the SEM column. The charge control electrode 166, which is configured to be used during pre-charging, i.e. operation of the flood gun, and which is configured to be used during inspection with a scanning electron beam, can be provided in the third chamber 23. That is, the flood gun and the SEM column are operated under the same vacuum condition, i.e. they share the same pressure within the vacuum chamber.

According to some embodiments, which can be combined with other embodiments described herein, the emission current of the flood gun can be up to 5 mA, for example, 50 µA to 500 µA, such as 100 µA to 300 µA. According to further additional or alternative embodiments, the flood gun aperture opening has a diameter in a range of 1 mm to 10 mm. For example the diameter of the flood gun aperture opening may be in a range from a lower limit of 1 mm, particularly from a lower limit of 2 mm, particularly from a lower limit of 4 mm to a upper limit of 6 mm, particularly to a upper limit of 8 mm, particularly to a upper limit of 10 mm. For example the diameter of the flood gun aperture opening can be 5 mm. Accordingly, the spot size of the flood gun electron beam in the plane of the specimen, e.g. a wafer, may essentially correspond to the diameter of the flood gun aperture opening as described herein. Accordingly, the flood gun as described herein is configured to generate a high emission current with a large spot size which enables scanning and charging of large surfaces to a desired potential in a short time.

According to some embodiments, which can be combined with other embodiments described herein, the flood gun aperture opening has a shape selected from the group consisting of: a round shape, circular shape, ellipsoidal shape, rectangular shape, square shape or any other suitable shape. Accordingly, the spot shape of the flood gun electron beam in the plane of the specimen may be may be selected.

According to embodiments, which can be combined with other embodiments described herein, the size and shape of the conductive membrane provided at the flood gun aperture opening is adapted to the size and shape of the flood gun aperture opening such that the conductive membrane covers the flood gun aperture opening.

Figure 3A:
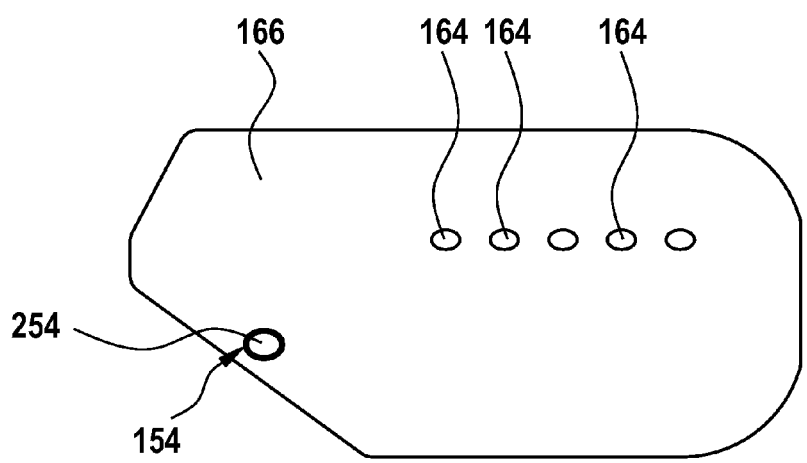
FIG. 3A illustrates a schematic view of a charge control electrode for a charged particle beam specimen inspection system according to embodiments described herein.

FIG. 3A shows a charge control electrode 166 according to embodiments described herein. The charge control electrode 166 has a flood gun aperture opening 154. As exemplarily shown in FIG. 3A the charge control electrode may include further openings 164, for example five openings for five electron beams of a scanning electron beam system. According to embodiments described herein, the charge control electrode may be provided in the third chamber 23, i.e. the vacuum chamber, as shown in FIG. 2, and is common for the SEM column and the flood gun. Accordingly, the charge control of the flood gun and the SEM column can be controlled by the same high voltage controller.

Further, as exemplarily shown in FIG. 3 a conductive membrane 254 is provided at the flood aperture opening or within the flood gun aperture opening. In particular, the size and the shape of the conductive membrane is adapted to the size and the shape of flood gun aperture opening such that the flood gun aperture opening is essentially covered by the conductive membrane. Accordingly, charged particles, for example electrons which are emitted from the flood gun can pass through the flood gun aperture opening 154 of the charge control electrode 166 and the conductive membrane. Accordingly a uniform and planar electrostatic field between the specimen, for example a wafer, and the charge control electrode may be generated. In particular, a constant surface potential at a specimen to be assessed can be generated such that imaging of surface details can be performed under constant imaging conditions. Accordingly, embodiments as described herein provide for imaging of specimens, e.g. a wafer, with constant contrast, constant resolution and without image drift.

Figure 3B:
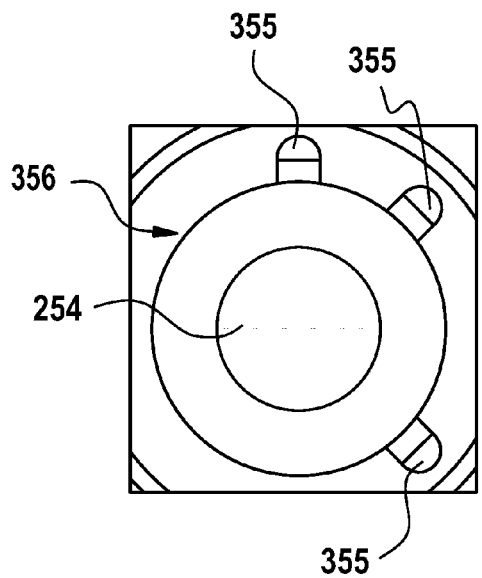
FIG. 3B illustrates a schematic view of a flood gun aperture opening in a charge control electrode according to embodiments described herein, wherein a conductive membrane is provided at the flood gun aperture opening.

As exemplarily shown in FIG. 3B, according to some embodiments which can be combined with other embodiments described herein, the conductive membrane 254 may be fixed in a replaceable holding structure 356 for holding the membrane. Accordingly, the conductive membrane can easily be replaced or exchanged, for example if other membrane properties are desired for imaging of a specimen. The holding structure may include one or more protrusions 355. The protrusions 355 can be used to provide fixation of the conductive membrane to the charge control electrode. The protrusions 355 may further be utilized for an electrical connection between the conductive membrane, the supporting grid and the charge control electrode. Yet further, the protrusions may serve for easy replacement of the conductive membrane.

Figure 3C:
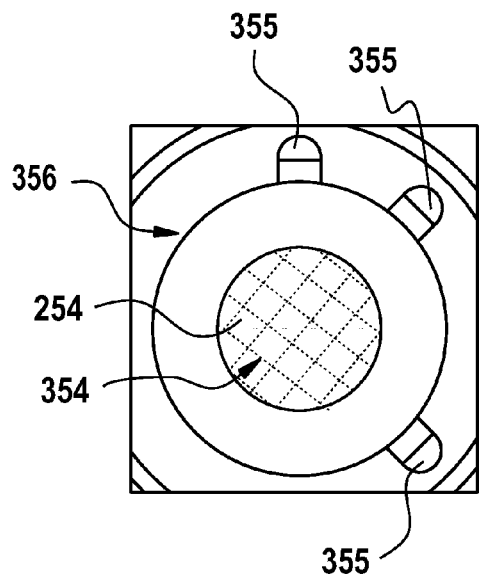
FIG. 3C illustrates a schematic view of an aperture opening in a charge control electrode according to embodiments described herein, wherein a conductive membrane is provided and stabilized by a supporting grid at the flood gun aperture opening.

According to embodiments which can be combined with other embodiments described herein, the conductive membrane may be stabilized by a supporting grid 354, as exemplarily shown in FIG. 3C and indicated by the dotted lines to illustrate that the supporting grid is behind the conductive membrane when viewed from the outer surface of the charge control electrode. Accordingly, by supporting the conductive membrane with a supporting grid the stability of the membrane can be improved. Hence, the longevity of the membrane can be increased.

According to embodiments which can be combined with other embodiments described herein, the supporting grid 354 may be of conductive material, for example metal. The supporting grid 354 may be connected or at least in contact with the conductive membrane. The supporting grid 354 may be biased to an electrical potential, for example the electrical potential of the charge control electrode. Accordingly, when the supporting grid is biased to a specific electrical potential the conductive membrane may be biased to the same specific electrical potential. By biasing the membrane to the potential of the charge control electrode, for example via the supporting grid, a uniform and planar electrostatic field can be provided. This improves the uniformity of the profile of the pre-charging.

As exemplarily shown in FIG. 3C, the supporting grid 354 may include a plurality of wires. For example, a first plurality of wires extending in a first direction and a second plurality of wires extending in a second direction, which is different from the first direction. For example, the second direction can be essentially perpendicular to the first direction. In particular, the second direction can have an angle of 80° to 100° with respect to the first direction. Accordingly the first plurality of wires and the second plurality of wires form the supporting grid.

According to some embodiments, which can be combined with other embodiments described herein, the first direction of the first plurality of wires and the second direction of the second plurality of wires is not parallel to one of the specimen movement directions of the specimen support table 50, which may for example move in an X-direction and a Y-direction. Further, additionally or alternatively, the first direction of the first plurality of wires and the second direction of the second plurality of wires are not parallel to one of the scanning directions of the charged particles emitted from the flood gun, which can be deflected by a beam deflection system within the flood gun. The scanning directions may also correspond to the X-director and the Y-direction of the specimen support table 50. Particularly, the first direction of the first plurality of wires and the second direction of the second plurality of wires can have an angle of 30° to 60°, for example about 45°, with respect to the X-direction or the Y-direction. Providing such an angle can avoid an uncharged line on the surface of the specimen when scanning the flood gun electrode over the specimen.

The supporting grid may include wires having a thickness of 5 μm to 100 μm. For example the supporting grid may be manufactured to have spaces between the wires of 80 μm to 200 μm. The ratio between the dimension of the wires and the dimension of may determine a blocking ratio, which may be 10% to 30%, for example about 20%.

In embodiments described herein in which a conductive membrane is stabilized by a supporting grid the protrusions 355 of the holding structure 356 may beneficially be used for providing a fixed orientation of the first direction of the first plurality of wires and the second direction of the second plurality of wires with respect to the specimen movement direction and/or scanning direction.

Figure 4A:
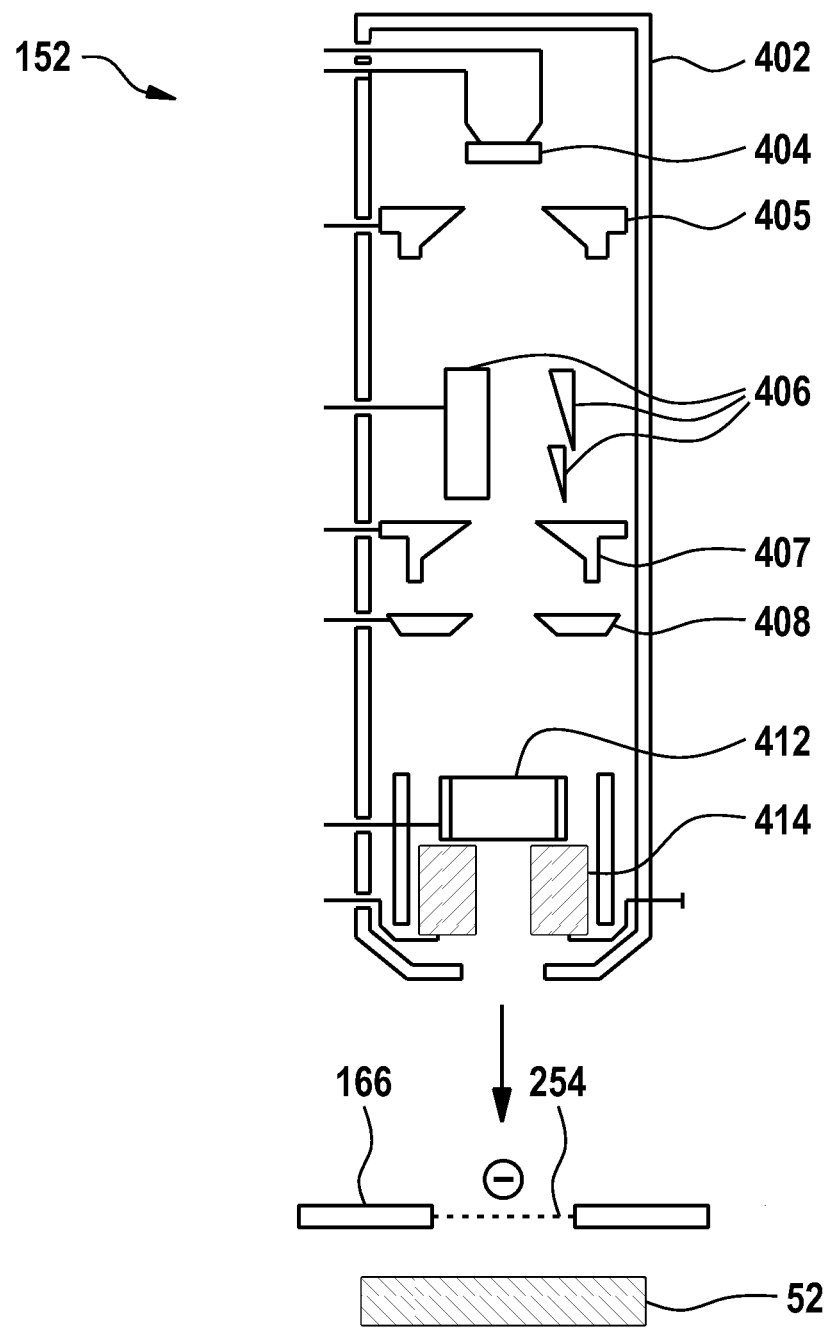
FIGS. 4A to 4C show schematic views of a flood gun according to embodiments described herein.

According to embodiments of the flood gun 152, as exemplarily shown in FIG. 4A, the flood gun may have a housing 402. With exemplarily reference to FIG. 4A the principle of a flood gun according to embodiments described herein will be described. Electrons are emitted from the emitter 404 and accelerated by the anode 405. According to some embodiments, a beam blanker system 406 can be provided. The beam blanker system can deflect the beam of electrons, such that the electrons are blocked by a beam blocker 407. An electrode 408 can be provided in order to focus the beam of charged particles. Accordingly, some embodiments may include a focusing option. The first beam scanning system 412 for deflecting the beam in a first direction, for example an X-direction, and the second beam scanning system 414 for deflecting the beam in a second direction, for example a Y-direction, can be provided. The beam deflection system of the flood gun may be configured to align the flood gun electrons to pass through the center of the aperture opening in the charge control electrode. The flood gun aperture opening is limiting the flood gun beam size on the wafer plane to the desired size and shape. Accordingly, charging in undesired regions of a specimen can be avoided by the limitation of the flood gun aperture opening.

FIG. 4A further shows the charge control electrode 166 having an aperture opening provided therein. The aperture opening in the charge control electrode 166 may be provided with a conductive membrane 254. The electrons emitted from the flood gun 152 may penetrate the conductive membrane 254 and impinge on a specimen 52, for example a wafer. According to embodiments described herein, the emission current can be controlled by controlling the source voltage $U_s$, as exemplarily indicated in FIGS. 4B and 4C. By controlling the source voltage, a constant emission current can be provided. The focusing lens provided by the electrode 408, for example provided by the potential of the electrode in combination with other electrodes and potentials within the flood gun 152, allows for controlling the spot diameter of the electrons emitted from the flood gun. Control of the spot diameter is beneficial in order to avoid flooding outside of the specimen surface during charging. Flooding outside of the desired region, for example on cables or the like may deteriorate the operation of the charged particle beam inspection system due to the high beam currents emitted by the flood gun. The control of the flooding on the desired services can further be improved by the beam blanker 406 and/or the first beam scanning system and the second beam scanning system, which may deflect the beam of electrons emitted from the flood gun.

Figure 4B:
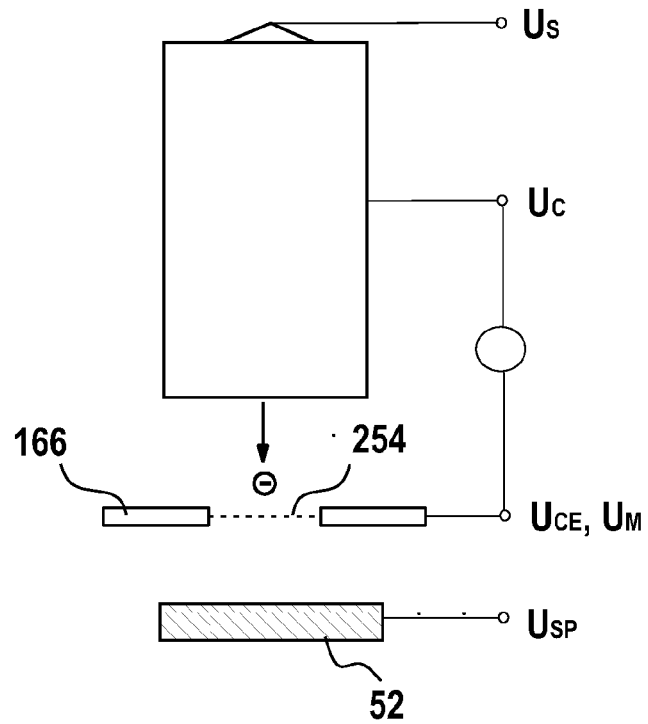
Figure 4C:
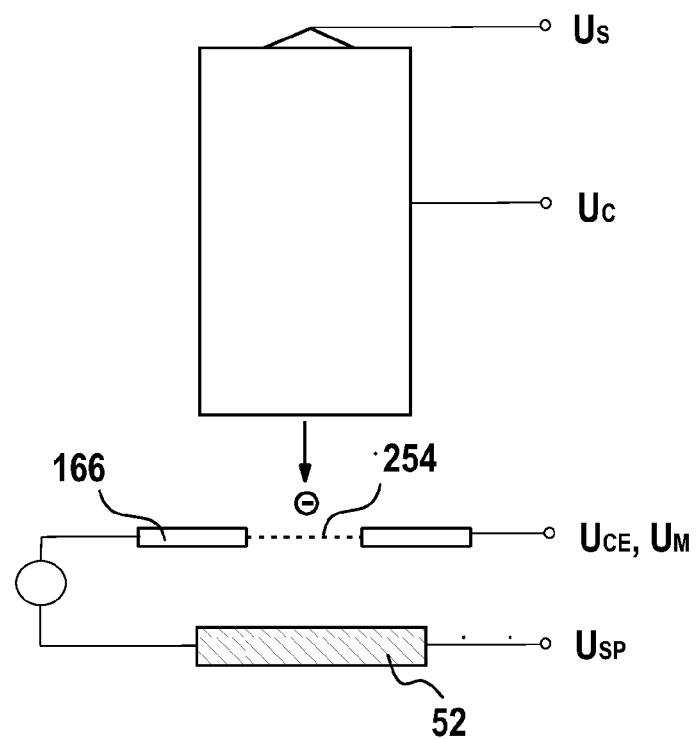

FIGS. 4B and 4C show schematic views of two different configurations of a flood gun according to embodiments described herein. In FIGS. 4B and 4C, $U_S$ indicates the source voltage/potential, $U_C$ indicates the voltage/potential in the column, $U_{CE}$ indicates the voltage/potential of the charge control electrode, $U_M$ indicates the voltage/potential of the conductive membrane, and $U_{SP}$ indicates the voltage/potential of the specimen.

In the configuration as exemplarily shown in FIG. 4B, the potential of the control electrode $U_{CE}$ and the conductive membrane is set to the potential in the column $U_C$. Accordingly, deceleration of the flooding beam to the landing energy happens between the conductive membrane 254 and the specimen 52. Hence, the penetration rate of the flooding beam in a configuration as exemplarily shown in FIG. 4B may be higher compared to a configuration in which a potential difference between the column potential $U_C$ and the potential of the control electrode $U_{CE}$ and the conductive membrane has been set. For example, the energy of the flooding beam may be 8 keV or higher. Accordingly, a configuration as exemplarily shown in FIG. 4B can assure a strong and homogeneous extraction field (for example >1 kV/mm) which forces a positive charging.

In the configuration as exemplarily shown in FIG. 4C, the potential of the control electrode $U_{CE}$ and the conductive membrane $U_M$ is set close to the potential of the specimen $U_{SP}$.

Accordingly, deceleration of the flooding beam to the landing energy happens between the flood gun optics and the conductive membrane 254. Accordingly, in configurations of the flood gun as exemplarily shown in FIG. 4C charging control of the specimen can be performed by setting the membrane potential, for example by a power supply, close to the specimen potential. According to embodiments which can be combined with other embodiments described herein the potential of the membrane potential $U_M$ may be set to allow for sufficient transmission through the membrane. For example, the membrane potential $U_M$ may be set such that landing energies of 5 keV or below are achieved.

Figure 5:
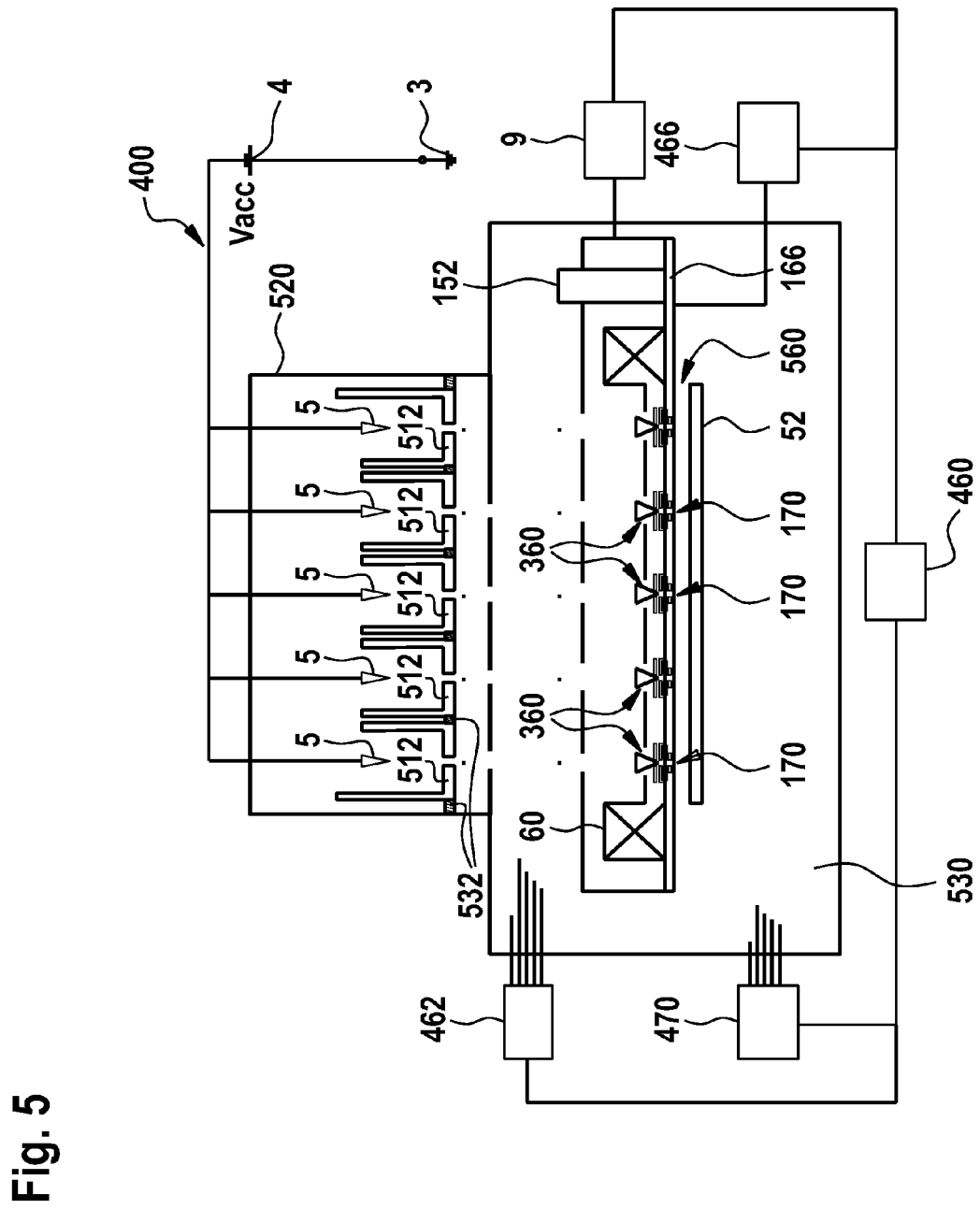
FIG. 5 shows a schematic view of multi-beam specimen inspection system having a flood gun according to embodiments described herein.

FIG. 5 illustrates yet further embodiments, wherein a retarding field scanning microscope, i.e. wafer imaging system 400 is provided as a multi-beam device. Typically, two or more beams can be provided in a multi-beam device. As an example, FIG. 5 shows five emitters 5 such that five electron beams are emitted in the gun chamber 520. This corresponds to the five aperture openings in the charge control electrode shown in FIG. 3A. The emitter tips are biased to an acceleration potential $V_{acc}$ by voltage supply 4, which provides a potential to the tips as compared to ground 3. Electrodes 512, e.g. extractors or anodes can be provided, e.g. in a cup-like shape. These electrodes are electrically insulated by insulators 532 with respect to each other and with respect to the gun chamber 520. According to some embodiments, which can be combined with other embodiments described herein, also two or more of the electrodes selected from the group consisting of extractor and anode can be provided. Typically, these electrodes 512 are biased to potentials by voltage supplies (not shown) in order to control the two or more electron beams.

The charged particle beams travel in a further chamber 530, in which a specimen 52 is provided. The objective lens 560 focuses the beams on the specimen or in a specimen plane, respectively. The objective lens 60 can have a magnetic lens assembly with a common magnetic lens portion, i.e. a magnetic lens portion acting on two or more of the charged particle beams. For example, one common excitation coil is provided to a pole piece unit or a pole piece assembly, wherein several openings for passing of the two or more electron beams through the pole piece unit are provided. The one common excitation coil excites the pole piece unit, such that, for example, one beam is focused per opening. Power supply 9 can provide the current for the magnetic lens portion of the objective lens.

As shown in FIG. 5, the objective lens 560 further includes an electrostatic lens component 360. For example, an electrostatic lens portion having one or more first electrodes and a second electrode are provided. The second electrode can be a charge control electrode with aperture openings for the scanned electron beams and an aperture opening for charged particles emitted from the flood gun. 152. As shown in FIG. 5, the first electrode can also be provided as a separated electrode for one or more of the electrostatic lens portions. That is the first electrode can be separate and/or independent of a beam guiding tube in the column. This can also apply for the single beam columns described herein. Further, for each of the electrons beams, a control electrode can be provided.

Three power supplies 462, 466 and 470 are shown in FIG. 5. Some of the power supplies have exemplarily five connection lines for respective electrodes for each of the five electrostatic lens components. For example, power supply 462 can be connected to the respective first electrodes, power supply 466 can have a single connection to the common charge control electrode, and power supply 470 can be individually connected to the respective control electrodes. The controller 460 is connected to the power supplies 462, 466 and 470 for the electrodes of the electrostatic lens components and the control electrodes. The various connection lines entering the column housing from some of the power supplies (the rest of which is omitted for better overview) illustrate that each of the electrodes for the individual beams can be controlled independently. However, it can be understood that one or more of the electrodes of the electrostatic lens components and one or more of the control electrodes can also be biased with a common power supply. Further, it is noted that particularly the power supply 462 can be omitted if the first electrode is grounded as explained above.

According to some embodiments, the objective lens can be provided according to any of the embodiments described herein. It has to be considered that particularly for EBI applications, but also for CD/DR applications, as compared to common wafer imaging, throughput is a critical aspect to be considered. The operational modes described herein are useful for high throughput. Also cold field emitters (CFE) and thermally assisted field emitters (TFEs) can be used to increase the throughput. Accordingly, the combination of a flood gun according to embodiments described herein with a CFE, a thermally assisted field emitter, or a Schottky emitter is particularly useful. As a further implementation, a combination with a multi-electron beam device as e.g. described with respect to FIG. 5 further provides a specific combination, which can be considered beneficial for the throughput of wafer inspection.

According to different embodiments, which can be combined with other embodiments described herein, a multi-beam wafer inspection system can include two or more beams, wherein one beam each can be provided in two or more columns, wherein two or more beams can be provided in one column, or both, i.e. two or more columns can be provided, wherein each of the two or more columns include two or more beams on the specimen, e.g. a wafer. If two or more columns are provided, they may share some components, e.g.

the charge control electrode. If two or more beams are provided in one column they may be generated by a combination of a multi-opening aperture plate and a deflection system such that two or more virtual sources are generated.

The embodiments described herein, may as well include additional components (not shown) such as condenser lenses, deflectors of the electrostatic, magnetic or compound electrostatic-magnetic type, such as Wien filters, stigmators of the electrostatic, magnetic or compound electrostatic-magnetic type, further lenses of the electrostatic, magnetic or compound electrostatic-magnetic type, and/or other optical components for influencing and/or correcting the beam of primary and/or signal charged particles, such as deflectors or apertures. Indeed, for illustration purposes, some of those components are shown in the figures described herein. It is to be understood that one or more of such components can also be applied in embodiments of the present disclosure.

Figure 6:
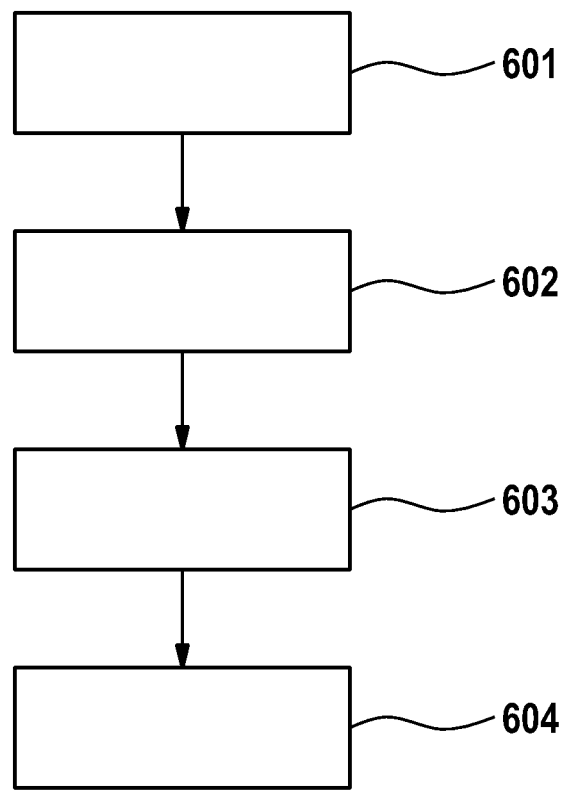
FIG. 6 shows a block diagram illustrating a method of operating a charged particle beam inspection system, according to embodiments described herein.

FIG. 6 shows a block diagram illustrating a method of operating a charged particle specimen imaging system according to embodiments described herein. The method includes biasing a charge control electrode to a first potential (exemplarily indicated by box 601). A specimen support table is moved for positioning a first portion of a wafer below a flood gun aperture opening in the charge control electrode, wherein at the flood gun aperture opening a conductive membrane is provided which is positioned between the flood gun and the specimen support table (exemplarily indicated by box 602). As indicated by box 603 the first portion of the wafer is pre-charged with charged particles emitted from a flood gun. After pre-charging the specimen support table is moved (exemplarily indicated by box 604) for positioning the first portion of the wafer below a first aperture opening in the charge control electrode, wherein the first aperture opening is aligned with an optical axis of an objective lens of a scanning charged particle beam unit.

By pre-charging the first portion of the wafer with a flood gun before imaging the first portion with a scanning charged particle beam unit, the pre-charging can be conducted faster as compared to, for example, pre-charging with the scanning charged particle beam unit itself. Accordingly, throughput can be increased. Further, the first portion of the wafer is provided below the charge control electrode while being moved from the pre-charging position to the imaging position. This is beneficial for improved charge control on the wafer to be inspected.

According to some embodiments, which can be combined with other embodiments described herein, the specimen or wafer (or the specimen support table, respectively) can also be biased to a specimen potential, for example a high potential, during imaging of the first portion of the wafer. Yet further, the specimen or wafer can be biased to the same specimen potential during pre-charging of the first portion of the wafer. Accordingly, the potential difference, i.e. the voltage, between the wafer and the charge control electrode is not varied when moving from the pre-charging position to the imaging position.

According to some embodiments, which can be combined with other embodiments described herein, the conductive membrane provided at the flood gun aperture opening may be biased with a membrane potential. For example, the membrane potential may include 70% to 100% of the specimen potential. Accordingly, the landing energy of the flooding beam may be adjusted by adjusting the potential difference between the conductive membrane and the specimen.

According to yet further embodiments, which can be combined with other embodiments described herein, the flood gun may also be provided for dis-charging of the portion of the wafer. For example, after positioning the first portion of the wafer below the first aperture opening in the charge control electrode and imaging the first portion of the wafer or at least area of the first portion of the wafer, charge may build up on the area of the wafer upon imaging of the area of the wafer. For dis-charging the area of the first portion of the wafer, the specimen support table may be moved back for positioning the first portion of the wafer below the flood gun aperture opening. The area of the first portion of the wafer can be dis-charged with the flood gun. The specimen support table can be moved back to the imaging position. In the imaging position, the imaging of the first portion of the wafer can be continued.

Embodiments described herein refer to an imaging charged particle beam unit, wherein the focused charged particle beam is scanned over the specimen, in combination with the flood gun, wherein the flood gun and the imaging charged particle beam unit, for example electron beam column, share the charge control electrode such as a proxi electrode. Further, the flood gun and the imaging charged particle beam unit can share a power supply for biasing the charge control electrode and the conductive membrane. According to yet further additional or alternative implementations, the flood gun and the imaging charged particle beam unit can share an objective lens housing, such that a common magnetic environment is provided for the flood gun and the imaging charged particle beam unit. Based upon the sharing of the charge control electrode and/or the objective lens housing, a beneficial distance between the flood gun and the imaging charged particle beam unit, for example a scanning electron microscope, can be provided. This beneficial distance allows for sufficient separation between the flood gun and the imaging charged particle beam unit. Yet, the flood gun and the imaging charged particle beam unit are close enough to allow for increased throughput, for example based upon reduced movement time of the specimen support table. Beyond that, according to some embodiments, the distance may further allow for pre-charging or dis-charging of one portion of a wafer while another portion of the wafer is imaged with the imaging charged particle beam unit. Accordingly, throughput can be further improved.

According to yet further details of some embodiments, which can be combined with other embodiments described herein, the flood gun charged particle source can be heated to different temperatures during operation of the charged particle beam wafer inspection system. For example, the flood gun charged particle source, such as the flood gun electron source, can be heated to an operation temperature for emitting charged particles, such as electrons. While the flood gun is not used for emitting charged particles, such as electrons, the flood gun charged particle source can be heated to a second temperature lower than the operation temperature. The second temperature can be a temperature sufficiently low enough such that no electrons are emitted from the charged particle source of the flood gun. Lowering the temperature during and idle time of the flood gun enables increasing the lifetime of the flood gun charged particle source.

Combining a flood gun in a scanning electron beam inspection system according to embodiments described herein as well as employing a flood gun as described herein in embodiments of the method of operating a charged particle beam specimen imaging system can be beneficial in light of one or more of the following aspects. (1) The flood gun and the scanning electron beam inspection system can share one or more of the optical elements, for example the charge control electrode above the wafer. Accordingly, further power supplies and respective controllers may be shared. This can inter alia reduce the costs of ownership and/or the system complexity. (2) The provision, additionally or alternatively, of a common magnetic environment by an objective lens housing can shield magnetic fields of nearby components, for example nearby SEM columns. (3) The common charge control electrode allows for charging the specimen or wafer surface utilizing the flood gun with the same charging conditions as compared to the charging conditions of a column of the electron beam inspection system. (4) The need for an alignment between the charging system and the scanning system can be reduced. (5) The stage movement between the charging system and the scanning system can be reduced. Accordingly, the time for stage movement and/or navigation errors can be reduced. (6) The specimen or wafer can be held at the same bias below the scanning system and the flood gun, wherein the cycle time between charging and scanning is reduced. Accordingly, it may even be possible to pre-charge one portion on a wafer while scanning or inspecting another portion of the wafer. The above aspects allow for increased throughput and/or reduced cost of ownership. (7) A constant surface potential at a specimen to be assessed can be provided which can assure that imaging of surface details may be performed under constant imaging conditions. Accordingly, embodiments as described herein provide for improved imaging of specimens, e.g. a wafer, with constant image contrast, constant resolution and without image drift.

While the foregoing is directed to embodiments of the disclosure, other and further embodiments of the disclosure may be devised without departing from the basic scope thereof, and the scope thereof is determined by the claims that follow.

The invention claimed is:

1. A charged particle beam specimen inspection system, comprising:
   an emitter for emitting at least one charged particle beam;
   a specimen support table configured for supporting a specimen;
   an objective lens for focusing the at least one charged particle beam;
   a charge control electrode provided between the objective lens and the specimen support table, wherein the charge control electrode has at least one aperture opening for the at least one charged particle beam; and
   a flood gun configured to emit further charged particles for charging of the specimen, wherein the charge control electrode has a flood gun aperture opening at which a conductive membrane is provided which is positioned between the flood gun and the specimen support table.

2. The charged particle beam specimen inspection system according to claim 1, wherein the conductive membrane has a thickness from a lower limit of 10 nm to an upper limit of 2 μm.

3. The charged particle beam specimen inspection system according to claim 1, wherein the conductive membrane is made of at least one material selected from the group consisting of: silicon oxide ($SiO_2$), silicon nitride ($Si_3N_4$), silicon carbide (SiC), diamond, graphene, and kapton.

4. The charged particle beam specimen inspection system according to claim 1, wherein the conductive membrane comprises a conductive coating.

5. The charged particle beam specimen inspection system according to claim 1, wherein the conductivity of the conductive membrane has been generated by a physical or chemical treatment, particularly ion implantation.

6. The charged particle beam specimen inspection system according to claim 1, wherein the resistivity of the conductive membrane is less than $1 \times 10^{11}$ Ωcm, particularly less than $1 \times 10^{10}$ Ωcm, particularly less than $1 \times 10^{9}$ Ωcm.

7. The charged particle beam specimen inspection system according to claim 1, wherein the flood gun aperture opening has a diameter in a range of 1 mm to 10 mm.

8. The charged particle beam specimen inspection system according to claim 1, wherein the flood gun aperture opening has a shape selected from the group consisting of: a round shape, circular shape, ellipsoidal shape, rectangular shape, square shape or any other suitable shape.

9. The charged particle beam specimen inspection system according to claim 1, wherein the conductive membrane covers the flood gun aperture opening.

10. The charged particle beam specimen inspection system according to claim 1, wherein the conductive membrane is fixed in a replaceable holding structure.

11. The charged particle beam specimen inspection system according to claim 1, wherein the conductive membrane is stabilized by a supporting grid.

12. The charged particle beam specimen inspection system according to claim 1, wherein the conductive membrane is electrically connected to the charge control electrode.

13. The charged particle beam specimen inspection system according to claim 1, wherein the charge control electrode is connected to a first power supply such that the charge control electrode is configured to provide a charge control for a first operation of the flood gun and to provide a charge control for a second operation of the emitter, both with the first power supply.

14. The charged particle beam specimen inspection system according to claim 1, wherein the specimen support table or the specimen provided on the specimen support table is connected to a second power supply.

15. A multi-beam specimen inspection system, comprising
   a charged particle beam specimen inspection system comprising:
      an emitter for emitting at least one charged particle beam;
      a specimen support table configured for supporting a specimen;
      an objective lens for focusing the at least one charged particle beam;
      a charge control electrode provided between the objective lens and the specimen support table, wherein the charge control electrode has at least one aperture opening for the at least one charged particle beam; and
      a flood gun configured to emit further charged particles for charging of the specimen, wherein the charge control electrode has a flood gun aperture opening at which a conductive membrane is provided which is positioned between the flood gun and the specimen support table;
   the multi-beam specimen inspection system further comprises:
   at least one further emitter for emitting at least one further charged particle beam, wherein the charge control electrode has at least one further aperture opening for the at least one further charged particle beam.

16. The multi-beam specimen inspection system according to claim 15, wherein the at least one further emitter is at least 4 further emitters to at least 19 further emitters and wherein the at least one further aperture opening is at least 4 further aperture openings to at least 19 further aperture openings.

17. A method of operating a charged particle beam specimen imaging system, comprising:
   biasing a charge control electrode to a first potential;

moving a specimen support table for positioning a first portion of a specimen below a flood gun aperture opening in the charge control electrode, wherein at the flood gun aperture opening a conductive membrane is provided which is positioned between the flood gun and the specimen support table;

pre-charging the first portion of the specimen with charged particles emitted from a flood gun; and moving the specimen support table for positioning the first portion of the specimen below a first aperture opening in the charge control electrode, wherein the first aperture opening is aligned with an optical axis of an objective lens of a scanning charged particle beam unit.

18. The method according to claim 17, further comprising: scanning a charged particle beam focused by the objective lens over an area of the first portion of the specimen.

19. The method according to claim 17, further comprising: biasing the conductive membrane provided at the flood gun aperture opening with a membrane potential.

20. The method according to claim 19, wherein the membrane potential comprises 70% to 100% of the specimen potential.

* * * * *